Figure 1:
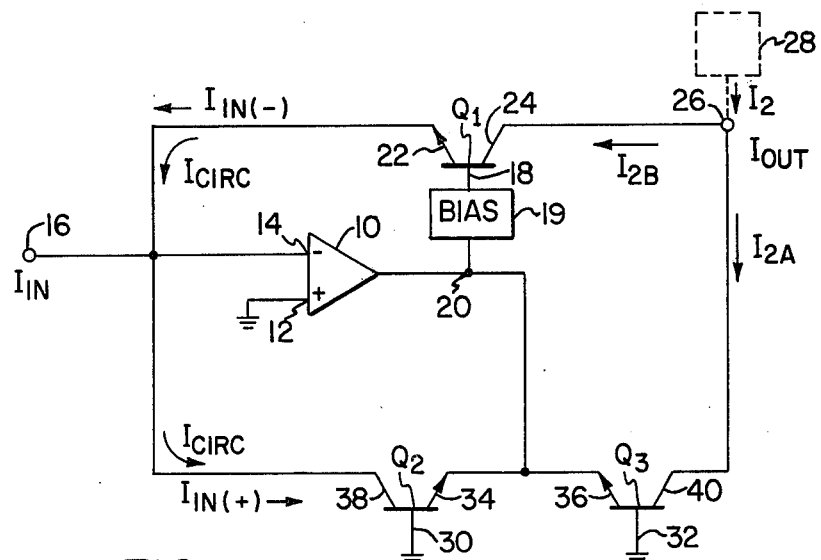

United States Patent [19]

Welland

[11] 4,329,598
[45] May 11, 1982

[54] BIAS GENERATOR

[75] Inventor: David R. Welland, Cambridge, Mass.

[73] Assignee: DBX, Inc., Newton, Mass.

[21] Appl. No.: 137,427

[22] Filed: Apr. 4, 1980

[51] Int. Cl.³ ............................................. H03K 3/01
[52] U.S. Cl. ................................. 307/296 R; 307/310
[58] Field of Search ....................... 307/310, 297, 296; 328/26

[56] References Cited

U.S. PATENT DOCUMENTS

| | | | |
|---|---|---|---|
| 2,802,071 | 8/1957 | Lin | 307/296 |
| 3,271,660 | 9/1966 | Hilbiber | 307/310 |
| 3,430,076 | 2/1969 | Overtveld | 307/310 |
| 3,935,478 | 1/1976 | Okada et al. | 307/296 |
| 4,093,907 | 6/1978 | Nutz | 307/297 |
| 4,097,767 | 6/1978 | Blackmer | 328/26 |

*Primary Examiner*—Harold A. Dixon
*Attorney, Agent, or Firm*—Schiller & Pandiscio

[57] ABSTRACT

An improved bias generator provides a bias voltage output which varies with temperature in accordance with a predetermined voltage-temperature function.

13 Claims, 2 Drawing Figures

BIAS GENERATOR

The present invention relates generally to bias generators, and more particularly to a supply for providing a bias voltage which varies with temperature in accordance with a predetermined voltage-temperature function.

Many circuits used in information transmission systems require biases to operate. Many of the supplies for providing biasing will generate (because of the particular component design of these supplies) biasing signals at their outputs which vary with changes in ambient temperature. Where the relationship between the variations in the bias voltage output and changes in temperature is substantially a linear function, the relationship can be thought of as defining a coefficient of temperature for that bias generator. In some instances variations in the biasing signal output, due to changes in ambient temperature, may have little effect on the transmitted signal through the circuit with which the supply is used. On the other hand, it may have a significant effect on errors appearing at the output of the circuit.

It is therefore a general object of the present invention to provide a bias generator having a voltage-temperature function which can be predetermined so that the bias output varies with temperature in a predictable manner.

Another, yet more specific object of the present invention relates to a bias generator having a voltage-temperature function which can easily be predetermined by providing a predetermined ratio of resistance values of two resistors.

In some situations the load of the circuit to which the generator of the present invention is connected may also exhibit characteristic changes in accordance with temperature variations due to the design of the circuit. It may be desirable to match the voltage-temperature function of the generator with the voltage-temperature function of the load provided by the circuit so that variations of the bias voltage with changes in ambient temperature will be offset by variations in the circuit load due to the same temperature changes.

For example, various circuits are known in which bias voltage generators are used to generate a predetermined bias voltage to induce a bias current in the circuit in order to achieve a predetermined mode of operation. One such circuit would be a Class A amplifier so that the latter operates in a Class A mode. Similarly, a bias current can be induced with a bias voltage so that an amplifier operates in a Class AB mode. Other types of amplifiers requiring biasing currents induced by bias voltages are known to those skilled in the art. In all of these amplifiers it may be desirable to match the voltage-temperature function of the bias generator with the voltage-temperature function of the amplifier circuit.

Another example of a circuit requiring a biasing signal is the operational rectification circuit such as the one described and claimed in U.S. Pat. No. 4,097,767 issued to David E. Blackmer and C. Rene Jaeger on June 27, 1978. In the patented circuit a biasing voltage can be used to induce a biasing current so as to reduce the slew rate of an operational amplifier stage in the rectification circuit. By utilizing the principles of the present invention an improved operational rectification circuit can be provided.

Accordingly, another object of the present invention is to provide an improved bias generator having a voltage-temperature function matched to the voltage-temperature function of the circuit to which it is used.

Another object of the present invention is to provide an improved operational rectification circuit of the type described in U.S. Pat. No. 4,097,767.

These and other objects of the present invention are achieved by an improved bias generator providing a bias voltage output which varies with changes in temperature in accordance with a predetermined voltage-temperature function.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims.

For a fuller understanding of the nature and objects of the present invention, reference should be had to the following detailed description taken in connection with the accompanied drawings wherein:

FIG. 1 shows a circuit of the type described in U.S. Pat. No. 4,097,767; and

Figure 2:
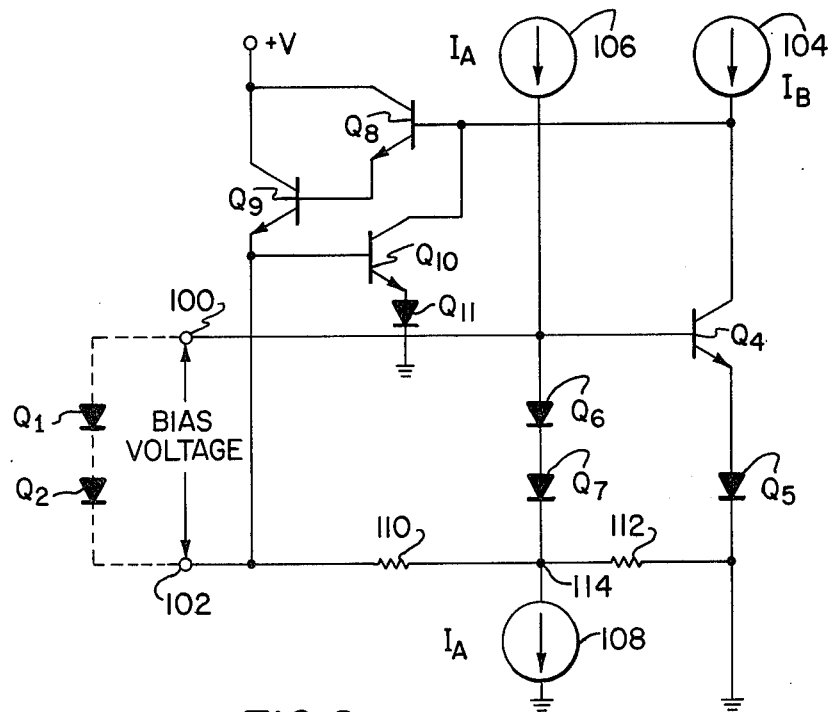

FIG. 2 shows a preferred embodiment of the bias generator designed in accordance with the present invention and adapted for use with the circuit of FIG. 1.

Like numerals and letters are used in the figures to designate like parts.

The operational rectification circuit shown in FIG. 1 is of the type described and claimed in U.S. Pat. No. 4,097,767. As described in that patent the circuit (1) may be easily manufactured in accordance with integrated circuit techniques since it can employ only NPN transistors, (2) does not require matched resistances or accurate resistance ratios, (3) employs only one operational amplifier and therefore no matching of amplifiers or trimming is required; (4) is not affected by any offset voltages which may exist between the input terminals of the operational amplifier, (5) provides in its preferred form broadband rectification in the nanoampere to milliampere range, (6) operates more nearly as a Class A device for low voltage, high frequency inputs with relatively relaxed slew rate requirements of the operational amplifier.

As shown in FIG. 1 the operational rectification circuit includes a high gain inverting amplifier 10. Amplifier 10 has its non-inverting input terminal 12 connected to system ground and its inverting input terminal 14 connected to input terminal 16 of the device for receiving AC current input signal $I_{in}$. Amplifier 10 is used as the amplifier stage in an operational amplifier configuration.

A first transmission path is provided by transistor $Q_1$ which in the illustrated embodiment is a NPN type transistor having its base 18 connected through the bias generator 19 to output terminal 20 of amplifier 10, its emitter 22 connected directly to input terminal 16 of the device and its collector 24 connected to output terminal 26 of the device. Means are provided for coupling output terminal 26 to an operational amplifier virtual ground shown schematically at 28 set at a predetermined DC voltage level with respect to system ground so that current $I_2$ is provided as shown. The DC voltage level is a positive value near ground. For example, one value of voltage level for virtual ground 28 found to be satisfactory is +0.5 DC volts relative to system ground. Transistor $Q_1$ is preferably a high grain transistor for reasons which will become more evident hereinafter.

For example, a gain of 100 is satisfactory although higher gains of up to 300 can be achieved using current IC techniques.

A second transmission path is provided by the transistors $Q_2$ and $Q_3$, each illustrated as NPN transistors having their respective bases 30 and 32 connected to system ground and their emitters 34 and 36 tied together to the output terminal 20 of amplifier 10. Collector 38 of transistor $Q_2$ is connected to inverting input terminal 14 of amplifier 10. Collector 40 of transistor $Q_3$ is connected to the output terminal 26. Preferably, transistors $Q_2$ and $Q_3$ are well matched geometrically for gain, size, etc., so that maintaining the two transistors at the same base-to-emitter voltage will provide equal collector currents.

In operation, when $I_{in}$ is of a positive polarity, the output of amplifier 10 is a negative voltage. With the base of transistor $Q_2$ then being positive with respect to its emitter, transistor $Q_2$ conducts current $I_{in}$ (+) from inverting input terminal 14 of amplifier 10 to output terminal 20 of the amplifier. Since the emitter of transistor $Q_2$ is connected to the emitter of transistor $Q_3$ and since their bases are also tied together (to ground), the base 32 of transistor $Q_3$ is positive with respect to emitter 36 so that transistor $Q_3$ also conducts a current $I_{2A}$. Since transistors $Q_2$ and $Q_3$ are matched and are always at the same base-to-emitter voltage, the instantaneous level of $I_{in}$ (+) equals the instantaneous level of $I_{2A}$. Thus, $I_{2A}$ is the mirrored current signal of $I_{in}$ (+). Because Kirchhoff's Law provides that currents flowing into a junction are equal to the currents flowing out of the junction, the instantaneous level of the current flowing to the output of amplifier 10 will be equal to the sum of the instantaneous values of $I_{in}$ (+) and $I_{2A}$.

Since the instantaneous level of $I_{in}$ (+) equals the instantaneous level of $I_{2A}$, the output current follows the input current when the latter is of a positive polarity. During this period, since the output signal of amplifier 10 applied to the base of transistor $Q_1$ is negative, transistor $Q_1$ will not conduct.

When the AC input current $I_{in}$ is of a negative polarity, amplifier 10 provides a positive output voltage. Emitter 34 of transistor $Q_2$ is then positive with respect to its base 30 and emitter 36 of transistor $Q_3$ is positive with respect to its base 32 so that neither transistor $Q_2$ nor $Q_3$ will conduct. However, collector 24 of transistor $Q_1$ is positive with respect to its emitter 22 so that a collector-emitter current will flow through transistor $Q_1$. This current flow is such that the emitter current $I_{in}$ (−), flowing from the emitter of transistor $Q_1$ to inverting input terminal 14 will be equal to the base current $I_b$ flowing from output terminal 20 of amplifier 10 to the base of the transistor $Q_1$ plus the collector current $I_{2B}$ flowing from virtual ground 28. The value of the base current $I_b$ is dependent on the gain of transistor $Q_1$, and by choosing a high gain transistor for transistor $Q_1$, the error introduced by $I_b$ will be negligible. For example, for a gain of 100, $I_b$ will be approximately 1% of $I_{in}$ (−), or $I_{2B}$ will be 99% of $I_{in}$ (−). Thus, for the example given, the instantaneous level of the output current appearing at terminal 26 will be substantially equal to the instantaneous level of the input current $I_{in}$ when the latter is positive, and approximately 99% of the instantaneous level of the input current $I_{in}$ (and of opposite polarity when the input current is negative). As described in U.S. Pat. No. 4,097,767 the error introduced by $I_b$ can be corrected if desired by properly adjusting the base voltage bias on transistors $Q_2$ and $Q_3$.

Without the biasing signal generator 19, i.e., connecting the base 18 of transistor $Q_1$ directly to output terminal 20 of amplifier 10, the slew rate and gain bandwidth product of amplifier 10 determines the amount of time that occurs when one transmission path stops conducting and the other transmission path starts conducting in response to a change in polarity in the output of the amplifier 10. The slew rate may be of little significance when the input signal $I_{in}$ swings between relatively large positive and negative levels. However, where the input signal $I_{in}$ is of a relatively small magnitude and at relatively high frequencies, the amount of time required for the output signal at terminal 20 of amplifier 10 to swing from a sufficient magnitude at one polarity so that one transmission path conducts to a sufficient magnitude at the other polarity so that the other transmission path conducts, can become significant since information contained in the input signal during this time is lost.

Accordingly, the bias generator 19 is provided between the output terminal 20 of amplifier 10 and the base 18 of transistor $Q_1$ in order to reduce the slew rate requirements. The generator 19 is described in U.S. Pat. No. 4,097,767 as a DC battery, or means for providing a current flow through a fixed resistance connected to base 18 of transistor $Q_1$. The base of the latter is connected to the anode of a diode, with the cathode of the diode connected to output terminal 20 of amplifier 10. This arrangement provides in effect a positive biasing voltage on the base of transistor $Q_1$ and a negative biasing voltage on the emitters of transistors $Q_2$ and $Q_3$. The biasing voltage produces a circulating current, $I_{circ}$, through the base-emitter path of transistor $Q_1$ which will be transmitted through the collector-emitter path of transistor $Q_2$. This results in a circulatory current $I_{circ}$ which has no effect on the value of the signal applied to the input of the device at terminal 16, but produces a current error at the output terminal 26 of the circuit which is twice the magnitude of $I_{circ}$. Thus, the bias generator 19 provides a tradeoff. By providing a cross-over bias voltage, the circuit will operate more nearly as a Class A device when the input signal crosses from one polarity to another, permitting better high frequency operation, since initial conduction through either transistor $Q_1$ or transistors $Q_2$ and $Q_3$ is not dependent upon the voltage level of the output of amplifier 10. However, inducing the circulating current $I_{circ}$ also results in the inducement of an error signal at the output terminal 26 of the circuit. Increasing the biasing voltage level provided by generator 19, decreases the slew rate and gains bandwidth requirements of amplifier 10 for a given performance of the circuit, but also increases the error signal at terminal 26 that is caused by $I_{circ}$.

It is therefore desirable to increase the bias potential provided by generator 19 to the point where the $I_{circ}$ error at terminal 26 is at its maximum acceptable level. This level must be five to ten times smaller than the smallest signal for which accurate rectification is desired. As the input current increases the $I_{circ}$ error will decrease. Thus, the $I_{circ}$ error is of concern at small signal levels.

Using bias generators of the type described in U.S. Pat. No. 4,097,767 can, however, provide problems. Changes in ambient temperature can affect the generator 19 so that the biasing potential is changed so as to change the $I_{circ}$ error at terminal 26. Changes in temperature can therefore cause undesirable changes in the $I_{circ}$ error to the point where $I_{circ}$ may become as large or larger than small signal levels of interest. Furthermore, even if the bias generator 19 is made temperature independent such that the biasing voltage output is temperature independent, the temperature dependence of transistors $Q_1$ and $Q_2$ and in particular the base-emitter voltage to collector current relationship of these two transistors can result in dramatic changes (a factor of hundreds over a range of 50 C) in the collector current with changes in temperature.

The foregoing will be more evident from the following discussion. As well known in the art, in the absence of generator 19 the necessary base-to-emitter voltage required to make transistors $Q_1$, $Q_2$ and $Q_3$ fully conductive at room temperature is approximately 0.6 volts. Thus, when the output of amplifier 10 is at $-0.6$ volts, the base-emitter voltage of transistors $Q_2$ and $Q_3$ is approximately $+0.6$ volts. Similarly, when the output of amplifier 10 is at $+0.6$ volts, the base-emitter voltage of transistor $Q_1$ is approximately $+0.6$ volts. In either of these situations a drastic increase in magnitude in the input signal level to the operational amplifier will not produce much of a change in the base-emitter voltages of the corresponding transistors. It is apparent that at the cross-over between the positive and negative regions of the input of amplifier 10, without generator 19 the amplifier must slew between $-0.6$ volts and $+0.6$ volts or a total of 1.2 volts. The biasing voltage provided by generator 19 however is subtracted from the 1.2 volts so the output of the amplifier does not have to slew as much. The value for the biasing voltage is usually determined by the maximum value of $I_{circ}$. An appropriate value for $I_{circ}$ which has been found satisfactory for the circuit shown in FIG. 1 is 1 nA. This value of $I_{circ}$ will allow a biasing voltage of approximately 600 mV for many transistors, (although this biasing voltage may vary from transistor to transistor) so as to provide a quiescent base to emitter voltage of approximately 0.3 volts on each base-emitter of transistors $Q_1$, $Q_2$ and $Q_3$. It will be appreciated that other values of maximum acceptable $I_{circ}$ can be used, although for many applications 1 nA appears to provide optimum results. Thus, with 0.6 volts bias the amplifier will have only to slew between $-0.3$ volts to $+0.3$ volts for a total of 0.6 volts. Where the quiescent current level $I_{circ}$ is 1 nA, an example of the generated $I_{circ}$ induced error through the transistor $Q_1$ or $Q_2$ which is ostensibly off will be 0.1 nA when the input signal is 10 nA. Specifically, when $I_{in}=+10$ nA the collector-emitter current through transistor $Q_2$ is approximately 10 nA (a factor of 10 above its quiescent level). Due to the exponential relationship between Vbe and Ic the $I_{circ}$ error through the collector-emitter of transistor $Q_1$ is then a factor of 10 below its quiescent current, or 0.1 nA. Since Kirchhoff's Current Law requires the sum of the currents into a node to equal the sum of the currents out of a node, the current through the collector-emitter of transistor $Q_2$ will actually then be 10.1 nA. These values of current provide an output at terminal 20 of amplifier 10 which is $-60$ mV away from the quiescent level. In a similar manner, when $I_{in}=-10$ nA then the collector emitter current through transistor $Q_1$ is approximately 10.1 nA and the $I_{circ}$ error through transistor $Q_2$ is approximately 0.1 nA. The output at terminal 20 of amplifier 10 thus moves $+60$ mV from the quiescent level. The amplifier thus slews only through 120 mV with a change in the input current from $+10$ nA to $-10$ nA. This is a reduction from the approximate 900 mV through which the amplifier must slew with a change in the input current from $+10$ nA to $-10$ nA when no bias voltage is provided. It should be noted that the 120 mV level is a function of temperature and more particularly will change from 120 mV at room temperature (300 K) to (375/300) multiplied by 120 mV at 100 C (375 K). The error attributed to $I_{circ}$ error at output terminal 26 will be twice the $I_{circ}$ error since the error signal will be present in both transmission paths simultaneously. Specifically, in the example given above when the input is 10 nA the current through the collector-emitter of transistor $Q_2$ is approximately 10.1 nA. The $I_{24}$ current through transistor $Q_3$ is approximately 10.1 nA. Simultaneously, the $I_{circ}$ error through the collector-emitter of transistor $Q_1$ is 0.1 nA. Using Kirchhoff's Current Law, the current at the output terminal 26 will be 0.2 nA different from the input current. This 0.2 nA is thus the resulting error of $I_{circ}$.

When $I_{in}=100$ nA then the collector emitter current through the collector emitter of transistor $Q_2$ is approximately 100 nA and $I_{circ}$ current through the collector emitter of transistor $Q_1$ is approximately 0.01 nA. When $I_{in}=-100$ nA then the collector emitter current through the collector emitter of transistor $Q_1$ is approximately 100 nA and the $I_{circ}$ through the collector emitter of transistor $Q_2$ is 0.01 nA. Similarly, $I_{in}$ currents of $+1$ mA and $-1$ ma produce an $I_{circ}$ current of 1 pA. It therefore can be generalized that under the conditions set forth an increase in 1 dB of current through the conducting half of the rectifier will correspond in a 1 dB drop in $I_{circ}$ through the transistors that are ostensibly off. Thus, the error (twice $I_{circ}$ error) at output terminal 26 becomes decreasingly important with increases in input, with the maximum error occuring at the cross-over or at very low input currents.

Use of the biasing generators described in U.S. Pat. No. 4,097,767 have not produced a reliably reproducible circuit in which the error attributed to the $I_{circ}$ error at the output terminal 26 is consistently reproduced at the same maximum acceptable levels. For example, where the circuit is placed in integrated circuit form, the maximum permissable $I_{circ}$ error may typically be 100 pico amps. The bias voltage for producing this maximum acceptable circulating current error might vary as much as 100 mV from circuit to circuit particularly when those circuits are on chips. This variation in the biasing voltage to provide the desired $I_{circ}$ error maximum level is due to the difference in the transistor characteristics of the transistors used from chip to chip.

Accordingly, the biasing signal generator shown in FIG. 2, incorporating the principles of the present invention can be utilized as the generator 19 in FIG. 1 to provide the appropriate biasing potential such that the $I_{circ}$ error will be reproducible from chip to chip as well as be temperature independent when the circuit is placed in IC form.

The generator of FIG. 2 comprises terminals 100 and 102 for connection with the circuit load, i.e. respectively to base 18 of transistor $Q_1$ and emitter 34 of transistor $Q_2$. For purposes of illustration the base-emitter path of transistor $Q_1$ and the collector-emitter path of transistor $Q_2$ are shown in FIG. 2 in diode form. Terminal 100 is connected to the base of transistor $Q_4$. The collector of transistor $Q_4$ is connected to the current source 104 providing current $I_B$ of a fixed amplitude, while the emitter of transistor $Q_4$ is connected to the anode of diode $Q_5$. The cathode of diode $Q_5$ is connected to a low impedance node, such as the output of an operational amplifier, or as shown to system ground.

Terminal 100 is also connected to the anode of diode $Q_6$, which in turn is connected to both the base of transistor $Q_4$ and the output of current source 106 which provides the current $I_A$ at a fixed level. The cathode of diode $Q_6$ is connected to the anode of diode $Q_7$, which in turn has its cathode connected to the junction 114 of the two resistors 110 and 112. The opposite side of resistor 110 from junction 114 is connected to input terminal 102 while the opposite side of resistor 112 is connected to system ground. Junction 114 is also connected to the input of current source 108 for producing the current $I_A$ with the output of the source being grounded. The output of current source 104 is also connected to a Darlington pair of transistors $Q_8$ and $Q_9$. More specifically, the output of source 104 is connected to the base of transistor $Q_8$ with the emitter of transistor $Q_8$ connected to the base of transistor $Q_9$. The collectors of transistors $Q_8$ and $Q_9$ are tied together to a positive DC voltage source, while the emitter of transistor $Q_9$ is connected to input terminal 102 and thus resistor 110. Finally, transistor $Q_{10}$ has its base connected to the emitter of transistor $Q_9$, its collector connected to the base of transistor $Q_8$ and its emitter connected through diode $Q_{11}$ to ground. It should be appreciated that in the embodiment shown diodes $Q_5$, $Q_6$ and $Q_7$ are NPN transistors, each connected in the diode mode, i.e., the collector of each transistor is connected to its base. Proper operation of the generator of FIG. 2 depends upon transistors $Q_4$, $Q_5$, $Q_6$ and $Q_7$ having matched Vbe/Ic characteristics with one another as well as transistors $Q_1$, $Q_2$ and $Q_3$ of the operational rectification circuit shown in FIG. 1 and requires that all of the transistors are exposed to the same temperature. This arrangement is easily met with current IC technology. Similarly, transistors $Q_8$, $Q_9$ and $Q_{10}$ are NPN transistors so that the entire circuit can be formed in accordance with IC techniques.

In operation a different current $I_B$ is provided from the source 104 than the current $I_A$ provided by each of the sources 106 and 108. With proper selection of the resistor and current source values, substantially all of the current flows from source 104 through transistor $Q_4$ and diode $Q_5$. Similarly, the current drawn from source 106 to the operational rectification circuit is negligible (as will become evident) so that substantially all of the current flowing from source 106 flows through diodes $Q_6$ and $Q_7$. Generally, at room temperature for each dB difference in current between $I_B$ and $I_A$, a difference of three millivolts in the diode drop (i.e. the base to emitter voltage of the diode-connected transistor) is provided across each diode $Q_6$ and $Q_7$ with respect to the diode drop (i.e., the base to emitter voltage of the diode connected transistor) provided across each of transistor $Q_4$ and diode $Q_5$. Thus, for example where $I_B=10I_A$ the difference in voltage drop across each diode $Q_6$ and $Q_7$ is approximately $-60$ millivolts or approximately a total of $-120$ millivolts across both diodes when compared to the voltage drops across transistor $Q_4$ and diode $Q_5$. In accordance with Kirchhoff's Voltage Law, the voltage drop across resistor 112 is therefore the voltage difference between the total voltage drop across diodes $Q_6$ and $Q_7$ and the total across the base-emitter junction of transistor $Q_4$ and diode $Q_5$. Thus, where $I_B=10I_A$ the voltage drop across resistor 112 is 120 millivolts.

In this example, the voltage across resistor 112 therefore corresponds to the decade difference in the current flowing through the double diodes $Q_6$ and $Q_7$ and the current flowing through both the emitter of transistor $Q_4$ and diode $Q_5$. Thus, when $I_B=10I_A$, the voltage drop at room temperature across resistor 112 is 120 millivolts. Similarly, where $I_B=100I_A$, the voltage drop at room temperature across resistor 112 is 240 millivolts.

The current through resistor 112 is therefore equal to the difference in the voltage drop of the diodes $Q_6$ and $Q_7$ and the base emitter voltage of transistor $Q_4$ plus the voltage drop of diode $Q_5$ divided by the value of resistor 112. In accordance with Kirchhoff's Current Law, the current through resistor 110 will equal the current through resistor 112 since the current through diodes $Q_6$ and $Q_7$, i.e. $I_A$ is equal to the current out of junction 114 drawn by the source 108 i.e., also set at $I_A$. The voltage across resistor 110 is equal to the current through resistor 110 multiplied by the resistance value of resistor 110.

The bias voltage provided across terminal 100 and 102 is equal to the voltage drop of diode $Q_6$ plus the voltage drop of diode $Q_7$ minus the voltage drop across the resistor 110 (the latter voltage drop being equal to sufficient voltage to change the current through transistors $Q_1$ and $Q_2$ by k decades less than $I_A$, where k is a constant (not necessarily an integer) equal to the ratio of the resistance value of resistor 110 to the resistance value of resistor 112.

In general, if $I_B=nI_A$ the voltage across resistor 112 will be that which when subtracted from the voltage across a diode string will cause the current through the string to be reduced by a factor of n. The voltage across resistor 110, then, will be that which when subtracted from the voltage across the diode string will cause the current through the string to be reduced by a factor of n raised to the kth power. Since the voltage across the output terminals 100 and 102 is the voltage drop across the diode string consisting of diodes $Q_6$ and $Q_7$ minus the voltage drop across resistor 110, and since diodes $Q_6$ and $Q_7$ are matched to transistors $Q_1$ and $Q_2$, the current through the latter string will be a factor of n raised to the kth power less than $I_A$.

For instance, if $I_A=10$ microAmps, $I_B=50$ microAmps, resistor $112=1$ kohm, and resistor $110=6$ kohms, the value of $I_{circ}$ will be 640 picoAmps-in this case $n=5$, $k=6$ and the $I_{circ}$ current through transistors $Q_1$ and $Q_2$ will be $5^6$ (15,625) less than 10 microAmps.

It should be readily appreciated that the voltage drop across resistor 110 is temperature dependent in accordance with a predetermined temperature coefficient since the voltage is proportional to the current flowing through resistors 110 and 112, which in turn is proportional to the voltage drop across resistor 112. The voltage drop across resistor 112 is equal to the difference in voltage drops across diodes $Q_6$ and $Q_7$ and the voltage drops across transistor $Q_4$ and diode $Q_5$. The voltage differential provided across resistor 112 is linearly related to temperature since the difference in the voltage drop across the pair of diodes $Q_6$ and $Q_7$ and the voltage drop across transistor $Q_4$ and diode $Q_5$ is linearly related to temperature. It should be appreciated that where transistor $Q_4$ and diodes $Q_6$, $Q_7$ and $Q_5$, i.e. diodes $Q_5$, $Q_6$ and $Q_7$ being transistors connected in a diode mode are matched with transistors $Q_1$ and $Q_2$ for their Vbe/Ic characteristics, and they are subjected to the same ambient temperature, a change in temperature will modify the bias voltage across terminals 100 and 102 by an amount equal to the change in voltage drop across diodes $Q_6$ and $Q_7$ as well as the change in voltage drop differential appearing across resistor 110. However, with respect to the change in voltage drop across diodes $Q_6$ and $Q_7$ an identical change in the base-to-emitter voltage drop is required in the base-emitter voltages of transistors $Q_1$ and $Q_2$ minus the change in the drop in the voltage across resistor 112 for constant $I_{circ}$, since they are matched for their Vbe/Ic characteristics. In this manner the temperature coefficient of generator 19 is matched with the temperature coefficient of the circuit. Thus, where the value of resistor 110 equals the value of resistor 112 the voltages drops across the resistors will be the same. In the instance where $I_B = 10I_A$ the voltage drop across each resistor 110 and 112 at room temperature will be 120 millivolts. Where the value of resistor 110 is twice the value of resistor 112, the voltage drop across the resistor 110 will be twice that of the voltage drop across resistor 112. In the instance where $I_B = 10I_A$, the voltage drop across resistor 110 will be $+240$ millivolts.

The $I_{circ}$ current produced through transistors $Q_1$ and $Q_2$ will be thus equal to n decades less than $I_A$, where n equals the ratio (not necessarily an integer) of the resistance value of resistor 110 to the resistance value of resistor 112. Thus, $I_{circ}$ equals one decade less than $I_A$ or $I_A/10$ when resistor 112 is equal to resistor 110. Similarly, where resistor 110 is twice resistor 112, $I_{circ}$ equals two decades less than $I_A$ or $I_A/100$, and so on.

Similarly, $I_{circ}$ will remain a function of the ratio of resistors 110 and 112 and $I_A$ and will not vary with temperature. Therefore, the change in the biasing voltage with temperature will not affect $I_{circ}$ which is set at the maximum acceptable level.

Transistors $Q_8$ and $Q_9$ provide the current to resistors 110 and 112 for the necessary voltage drop. In particular, transistors $Q_8$ and $Q_9$ provide negative feedback as well as serve as a buffer current source 104 and resistors 110 and 112. When current through resistor 112 is insufficient to provide the measured voltage drop, current is diverted from source 104 to the base of transistor $Q_8$ making transistor $Q_9$ sufficiently conductive to provide the necessary current to resistors 110 and 112. Transistor $Q_{10}$ limits the current drawn from source 104 to the transistors $Q_8$ and $Q_9$ so that a latching situation, which can occur under certain conditions peculiar to the load across terminals 100 and 102 and the form of the low impedance node to which diode $Q_5$ is connected (showed diagramatically in FIG. 2 as ground), can be averted.

Although the bias generator has been described in its preferred form, there are various changes that can be made to the generator without departing from the scope of the invention. For example, the number of reference diodes connected between source 106 and junction 114 and the number between the emitter of transistor $Q_4$ and the low impedance node shown as ground can vary from the respective number shown in FIG. 2. In particular, the number of reference diodes used between source 106 and junction 114 to form one string is equal to the number of semiconductive elements of the load and the circuit applied across terminals 100 and 102. Similarly, the number provided between the emitter of transistor $Q_4$ and the low impedance node shown as ground to form a second string is one less than the number of semiconductive elements of the load of the circuit applied across terminals 100 and 102 since the base emitter of transitor $Q_4$ functions as a reference diode. Additionally the reference diodes in each string are of a like kind and matched to those of the load of the circuit provided across terminals 100 and 102. Thus, if the load comprises two NPN transistors as shown, then diodes $Q_5$, $Q_6$, $Q_7$ and transistor $Q_4$ are matched NPN's as previously described. However, if the load were to comprise one NPN transistor and one PNP transistor, then the diodes $Q_6$ and $Q_7$ would be NPN and PNP transistors, and diode $Q_5$ a PNP transistor with the PNP transistors being matched and the NPN transistors being matched. In this regard it is noted that where the load comprises all PNP transistors, the generator can be modified in a manner obvious to one skilled in the art by making transistors $Q_4$, $Q_8$, $Q_9$ and $Q_{10}$ PNP transistors as well as all the diodes in each string PNP's, with all of the transistors being matched with similar polarity changes in the polarity of the current sources 104, 106 and 108. Finally, not all NPN's may be matched nor PNP's match, so long as each semiconductive element in the load is matched to a semiconductive element of a like kind in each string.

It will be appreciated from the foregoing, that the bias signal generator of the present invention will track temperature in accordance with temperature as a function of the voltage drop across the base-emitter of one or more semiconductive transistors and the ratio of resistors 110 and 112 and will provide the maximum acceptable $I_{circ}$ as a function of resistors 110 and 112, the current level provided by source 106 and the ratio of the currents provided by sources 106 and 104. The use of the bias signal generator of the present invention in the operational rectification circuit of the type described in U.S. Pat. No. 4,097,767 provides an improved operational rectifier.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A bias generator for providing a bias voltage to a circuit, said generator comprising:
    signal generating means for generating said bias voltage, said signal generating means comprising means for setting the level of said bias voltage so that said bias voltage varies as a function of the change of the voltage drop across the base-emitter junction of a semiconductive transistor with variations in ambient temperature, said means for setting said level of said bias voltage including means for defining a first reference voltage, means for defining a second reference voltage, means for providing a difference voltage in response to a comparison between said first and second reference voltages, means for generating a multiple signal equal to said difference signal multiplied by a constant k, and means for summing said multiple signal with said first reference signal so as to form said biasing voltage;
    wherein said difference voltage being related to the change in voltage drop across the base emitter junction of at least one semiconductor transistor as a function of the change of temperature.

2. A generator according to claim 1, wherein said means for defining said first reference voltage includes a first source of current $I_A$ at a first predetermined level and first semiconductive means for conducting said current $I_A$ to define a first voltage drop across the base-emitter junction of at least one semiconductor transistor, and wherein said means for defining said second reference voltage includes a second source of current $I_B$ to define a second voltage drop across the base-emitter junction of at least one other semiconductor transistor, and said means for providing said difference voltage includes means for subtracting said first voltage drop from said second voltage drops to define said difference voltage.

3. A generator according to claim 2, wherein said means for subtracting said first and second voltage drops includes a first resistor, and said means for generating said multiplied signal includes a second resistor connected to said first resistor so that current generated through said first resistor is supplied through said second resistor and said constant k is defined by the ratio of said second resistor to said first resistor.

4. A generator according to claim 3, wherein $I_B=nI_A$, where n is a constant different from one.

5. A generator according to claim 4, further including a pair of output terminals for connecting said generator to input bias terminals of said circuit, such that the load of said circuit connected across said input bias terminals defines a voltage-temperature function identically with the voltage-temperature function of said first semiconductive means.

6. A bias voltage generator for providing a biasing voltage across and a biasing current through input biasing terminals of a circuit, said circuit being of the type providing a load across said input biasing terminals such that variations in voltage drop across said load of said circuit occur with changes in temperature, said generator comprising:

means for providing said biasing current at a predetermined level;

means for generating said biasing voltage; and means for varying said biasing voltage as a function of the change in voltage drop across at least one base-emitter junction of a semiconductive transistor with variations in temperature, said means for varying said biasing voltage including means for defining a first reference voltage, means for defining a second reference voltage, means for providing a difference voltage in response to a comparison between said first and second reference voltages, means for generating a multiple signal equal to said difference signal multiplied by a constant k, and means for summing said multiple signal with said first reference signal so as to form said bias voltage;

wherein said difference voltage is related to the change in voltage drop across the base emitter junction of a semiconductor transistor as a function of the change of temperature.

7. A generator according to claim 6, wherein said means for defining said level of said first reference voltage includes a first source of current $I_A$ at a first predetermined level and first semiconductive means for conducting said current $I_A$ to define a first voltage drop across the base-emitter junction of at least one semiconductor transistor, said means for defining said level of said second reference voltage includes a second source of current $I_B$ at a second predetermined level and second semiconductive means for conducting said current $I_B$ to define a second voltage drop across the base-emitter junction of at least one other semiconductor transistor, and said means for providing said difference voltage includes means for subtracting said first voltage drop from said second voltage drop to define said difference voltage.

8. A generator according to claim 7, wherein said means for subtracting said first and second voltage drops includes a first resistor, and said means for generating said multiple signal includes a second resistor connected to said first resistor so that current generated through said first resistor is generated through said second resistor and said constant k is defined by the ratio of said second resistor to said first resistor.

9. A generator according to claim 8, wherein said biasing current equals the change in the current $I_A$ by n raised to the kth power.

10. A generator according to claim 8, wherein $I_B=nI_A$, where n is a constant different from one.

11. A generator according to claim 10, further including means for supplying current through said second and first resistors.

12. A generator according to claim 11, wherein said means for supplying current includes feedback means for generating current through said first and second resistors when said means for subtracting said second reference voltage from said first reference voltage is inadequate in generating current through said resistors.

13. An improved voltage bias source for use with a device for rectifying an AC current input signal applied at its input terminal and adapted to have its output terminal connected as a DC source, the device being of the type comprising (1) an amplifier having an output terminal and an input terminal, said input terminal of said amplifier being coupled to the input terminal of said device; (2) a first transmission path including first controllable current conveying means coupled between the input and output terminals of said device and connected to be controlled by the output signal from said amplifier so that current flows between the input and output terminals of the device along said first transmission path only when said input signal is of a first polarity; (3) a second transmission path including second controllable current conveying means coupled between the input and output terminals of said device and connected to be controlled by the output from said amplifier so that a second current flows between said input and output terminals of said amplifier stage along said second transmission path and an inverted current substantially equal in magnitude but opposite in polarity to said second current simultaneously flows between the output terminal of said amplifier and the output terminal of said device along said second transmission path only when said input signal is of a polarity opposite said first polarity; and (4) voltage biasing means coupled to the output terminal of said amplifier and each of said first and second controllable current conveying means for producing a biasing voltage at the output terminal of said amplifier so as to reduce the slew rate of said stage; wherein said voltage biasing means produces a circulating current in said first and second transmission paths and a current error at the output terminal of said device; comprising the improvement wherein said voltage biasing means comprises means for providing a circulating current having a maximum predetermined value and an output voltage which varies with temperature in the same manner that the voltage drop provided by said device varies with temperature.

* * * * *